(12) United States Patent
Voo

(10) Patent No.: US 7,538,616 B1
(45) Date of Patent: May 26, 2009

(54) WIDEBAND LOW DISTORTION/LOW POWER

(75) Inventor: Thart Fah Voo, Singapore (SG)

(73) Assignee: Marvell International Ltd. (BM)

( * ) Notice: Subject to any disclaimer, the term of this patent is extended or adjusted under 35 U.S.C. 154(b) by 114 days.

(21) Appl. No.: 11/527,940

(22) Filed: Sep. 26, 2006

Related U.S. Application Data

(60) Provisional application No. 60/780,887, filed on Mar. 9, 2006, provisional application No. 60/783,909, filed on Mar. 20, 2006.

(51) Int. Cl.
*H03F 3/45* (2006.01)

(52) U.S. Cl. ........................ 330/261; 330/253

(58) Field of Classification Search ............ 330/252, 330/253, 261, 300
See application file for complete search history.

(56) References Cited

U.S. PATENT DOCUMENTS 5,343,163 A * 8/1994 Linder et al. ............... 330/252
5,736,885 A * 4/1998 Wietecha et al. ........... 330/261
6,958,650 B1 10/2005 Teo ............................ 330/252

* cited by examiner

*Primary Examiner*—Khanh V Nguyen

(57) ABSTRACT

A differential circuit is described having first, second, third and fourth devices, each device having a control terminal and first and second terminals. The first and second devices are arranged to receive a differential input signal at their respective control terminals and each drive an end of a load in communication with a second terminal of the first and second devices. The third and fourth devices are in communication, via their first terminals, with the second terminal of a respective one of the first and second devices and with a respective one of the first and second input signals via their control terminals. The third and fourth devices each have second terminals biased with an impedance arranged so that variations in load current requirements are accommodated by the third and fourth devices and current through the first and second devices is substantially constant.

65 Claims, 10 Drawing Sheets

//  WIDEBAND LOW DISTORTION/LOW POWER

CROSS-REFERENCE TO RELATED APPLICATIONS

This application claims the benefit of U.S. Provisional Application No. 60/780,887, filed Mar. 9, 2006, and claims the benefit of U.S. Provisional Application No. 60/783,909, filed Mar. 20, 2006, and the entirety of these applications are hereby incorporated by reference.

BACKGROUND

Driver or buffer circuits are often used to help isolate outputs and match output impedance to expected load impedances. An example of one known differential output driver 100 is illustrated in FIG. 1. The driver 100 includes a pair of transistors $Q_1$, $Q_2$ in a push-pull configuration driving a resistive load $R_L$. A direct current (DC) bias circuit 102 maintains a constant DC current through the transistors $Q_1$, $Q_2$. The DC bias circuit includes a pair of transistors $M_1$, $M_2$ with gates tied to the gate of a transistor $M_0$ driven by a current source $I_0$. Unfortunately, this type of driver can generate undesirable amounts of distortion.

As the input voltages $V_p$ and $V_m$ change during operation of the driver 100, the output voltages of $Q_1$ and $Q_2$, $V_{op}$ and $V_{om}$, respectively, change. In this example, the current through $R_L$ may be calculated as $I_L=(V_{op}-V_{om})/R_L$. The change in load current $I_L$ is accommodated by a change in the current through the transistors $Q_1$ and $Q_2$ because the DC bias circuit 102 maintains a fixed $I_{p2}$ and $I_{m2}$. As shown in FIG. 2, when $V_{op}-V_{om}$ is at a maximum, $I_{p1}$ is at a maximum and $I_{m1}$ is at a minimum. Similarly, when $V_{op}-V_{om}$ is at a minimum, $I_{m1}$ is at a maximum and $I_{p1}$ is at a minimum. The current swing of $I_{p1}$ and $I_{m1}$ is offset by $I_{p2}$ and $I_{m2}$.

The modulation index for this swing in transistor current may be defined as $I_Q(\max,\min)/I_Q(DC)$, where $I_Q(\max,\min)$ is the maximum or minimum total current through the transistor (i.e., bias current +/-load current) and $I_Q(DC)$ is the bias current through the transistor, which is substantially constant. Even a small change in load current $I_L$ may lead to distortion because the change in load current is reflected by a proportional change in transistor current for the output transistors $Q_1$, $Q_2$. The larger the load current swing, the larger the modulation index, and the larger the distortion. This is because the transconductance of $Q_1$ and $Q_2$ varies as the current through these transistors varies. A variation in transconductance results in a variable gain because the base-emitter voltage drop in $Q_1$ and $Q_2$ varies with changes in transistor current.

One way to reduce the modulation index in the driver of FIG. 1 is to increase the DC bias current. By increasing the DC bias, the significance of variations in the load current can be reduced. Although the modulation index can be reduced in this manner, it merely masks the continuing problem of the distortion in the driver 10. Also, reducing distortion by increasing DC bias involves greater power consumption and may be unacceptable in low power applications.

SUMMARY

The present invention is defined by the attached claims, and nothing in this section should be taken as a limitation on those claims. In order to address the drawbacks discussed above, described below is a low distortion, low power differential driver and method. According to one aspect, a differential circuit includes first, second, third and fourth devices each having a control terminal, a first terminal and a second terminal. A first input terminal is in communication with the control terminal of the first device and with the control terminal of the fourth device. A second input terminal is in communication with the control terminal of the second device and with the control terminal of the third device. A first output terminal is in communication with the second terminal of the first device and the first terminal of the third device. A second output terminal is in communication with the second terminal of the second device and the first terminal of the fourth device. Also, a biasing element is in communication with the second terminal of the third and fourth devices, where an impedance of the biasing element is substantially equal to an impedance of an expected load between the first and second output terminals. The biasing element may be a shared resistive or complex impedance. The biasing element may also be divided into separate biasing elements in communication with the second terminal of the third and fourth devices, respectively. The impedance of the biasing element, or the sum of the impedances of the separate biasing elements, is selected to match an impedance of the expected load between the first and second output terminals. In other implementations, the differential circuit may include fifth and sixth devices each comprising a control terminal, a first terminal and a second terminal, where the first input terminal is in communication with the control terminal of the fifth device and the control terminal of the fourth device is in communication with the first input terminal via the fifth device. In this implementation, the second input terminal is in communication with the control terminal of the sixth device, and the control terminal of the third device is in communication with the second input terminal via the sixth device.

According to another aspect of the invention, a differential circuit is disclosed having first and second devices each comprising a control terminal, a first terminal and a second terminal. A first input terminal is in communication with the control terminal of the first device, where the first terminal of the first device is configured for communication with a supply voltage and the second terminal of the first device defines a first output configured for communication with a first terminal of a load. A second input terminal is in communication with the control terminal of the second device, where the first terminal of the second device is configured for communication with the supply voltage and the second terminal of the second device defines a second output configured for communication with a second terminal of the load. A biasing network is in communication with the first and second input terminals, and with the second terminal of each of the first and second devices, where the biasing network is adapted to maintain a DC bias current in each of the first and second devices. The biasing network is further adapted to be responsive to changes in input voltage at the first or second input terminals to supply drive current to the load while maintaining a substantially constant current through the first and second devices.

In yet another aspect, a differential circuit includes first and second devices each comprising a control terminal, a first terminal and a second terminal. A first input terminal is in communication with the control terminal of the first device, where the first terminal of the first device is configured for communication with a supply voltage and the second terminal of the first device defines a first output configured for communication with a first end of a load. A second input terminal is in communication with the control terminal of the second device, where the first terminal of the second device is configured for communication with the supply voltage and the second terminal of the second device defining a second output configured for communication with a second end of the load. The differential circuit further includes means for maintaining a DC bias current in each of the first and second devices, as well as means for supplying drive current to the load in response to changes in input voltage at the first and second input terminals while maintaining a substantially constant current through the first and second devices.

In another aspect of the invention, a method is disclosed for driving a differential circuit. A first input signal is received at a first device in the differential circuit and a second input signal is received at a second device of the differential circuit. A load current is provided to a load in communication with the first and second devices. A substantially constant device current in each of the first and second devices is maintained when the load current changes. In one implementation, maintaining a substantially constant device current may be accomplished by automatically adjusting the load current via a load current drive circuit in response to a change in the first or second input signals.

The following description will now be described with reference to the attached drawings.

DETAILED DESCRIPTION

Figure 1:
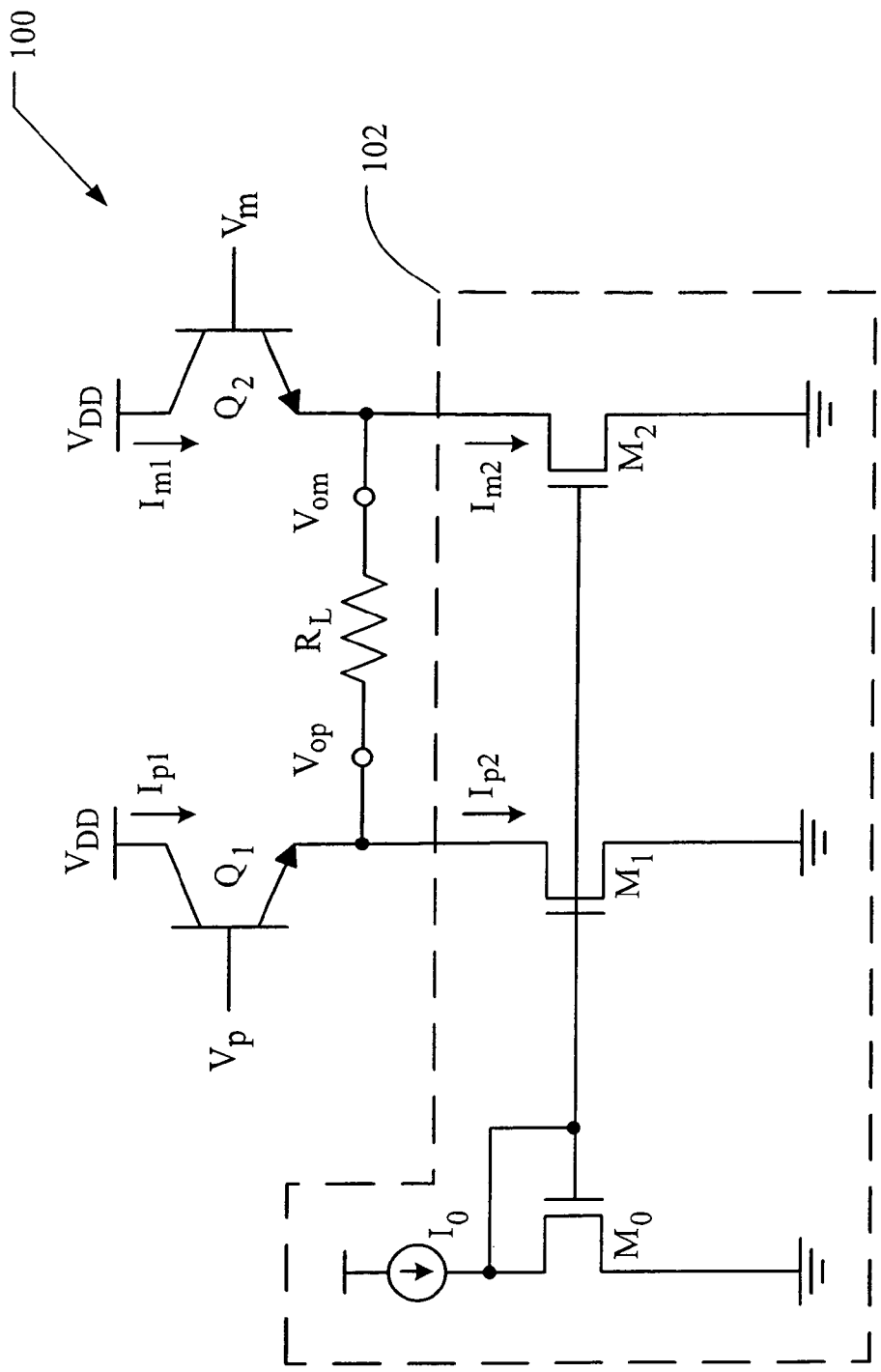
FIG. 1 is a circuit diagram of a prior art driver circuit.
Figure 2:
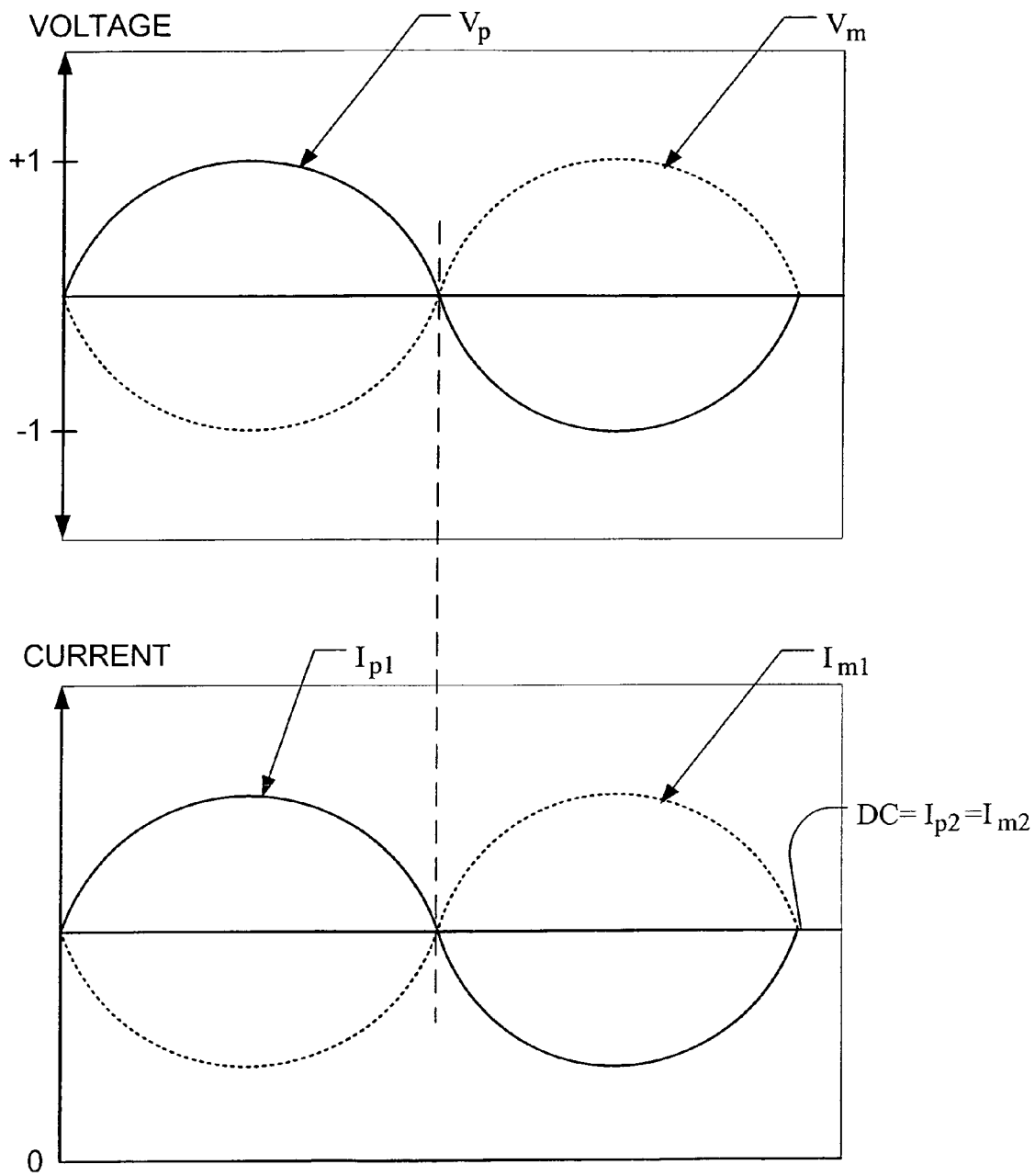
FIG. 2 is a graph illustrating device current response in relation to input voltage for the driver circuit of FIG. 1.
Figure 3:
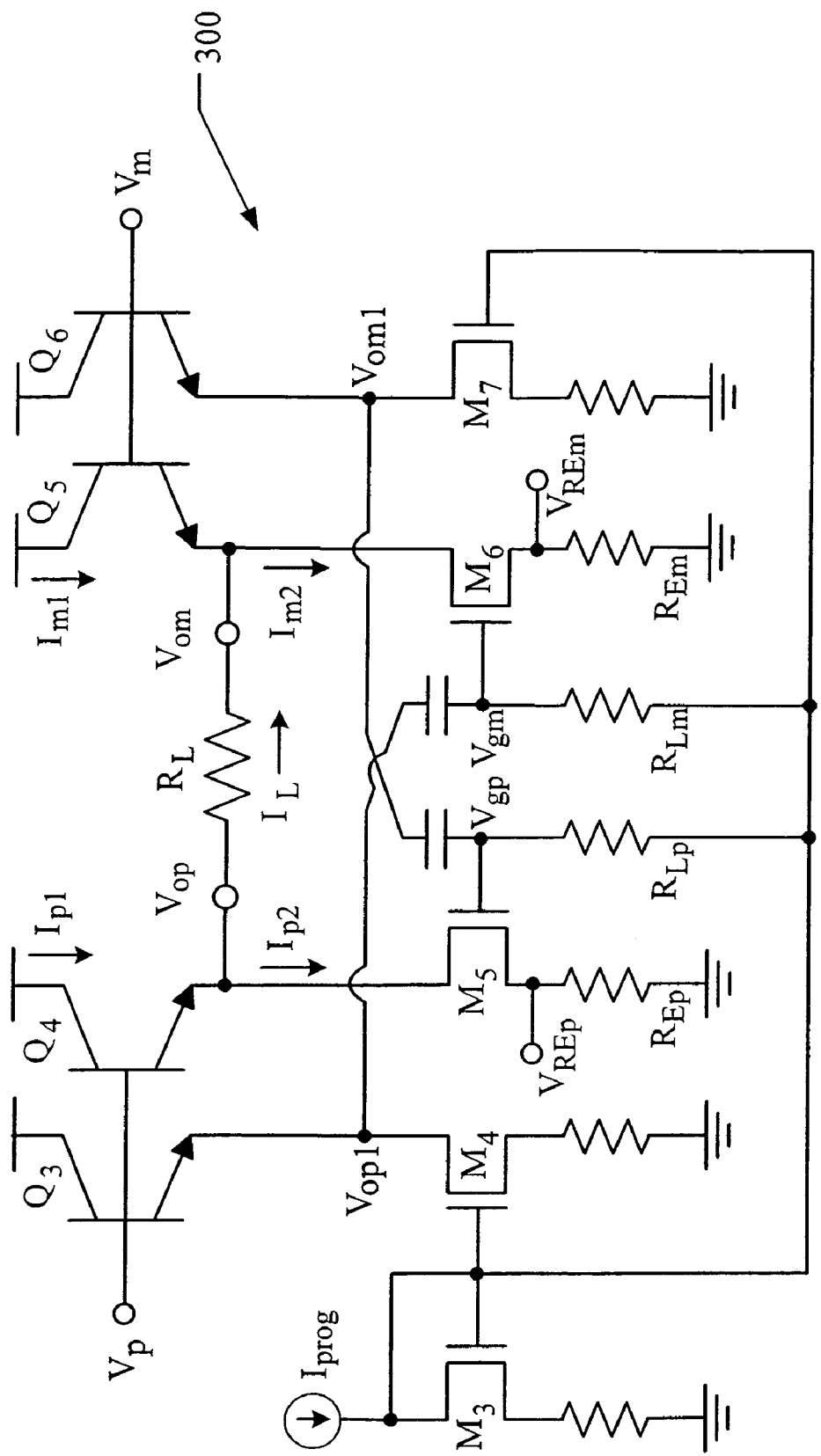
FIG. 3 is a circuit diagram of a low distortion, low power driver according to one embodiment.

Referring to FIG. 3, a driver circuit 300 is shown. The driver circuit 300 is a differential driver with a positive input terminal $V_p$ and a negative input terminal $V_m$. The positive input terminal $V_p$ is connected to the base of transistors $Q_3$ and $Q_4$. The negative input terminal $V_m$ is connected with the base of transistors $Q_5$ and $Q_6$. Transistors $Q_4$ and $Q_5$ are each arranged in an emitter-follower arrangement with the positive output terminal $V_{op}$ connected to the emitter of $Q_4$ in the negative output terminal $V_{om}$ connected to the emitter of $Q_5$. Transistors $Q_3$, $Q_4$, $Q_5$, and $Q_6$ are shown as bipolar junction transistors however other devices, such as three terminal devices, are also contemplated. Additionally, other types of transistors, for example field effect transistors, may be used.

Each of the transistors $Q_3$, $Q_4$, $Q_5$, and $Q_6$ is coupled to respective DC bias transistors $M_4$, $M_5$, $M_6$ and $M_7$. Although illustrated as field effect transistors, other device types, such as bipolar junction transistors, are also contemplated. Transistors $M_4$, $M_5$, $M_6$ and $M_7$ each have their gate connected to the gate of transistor $M_3$. The current source $I_{prog}$, which may be a fixed or programmable current source, is connected with the drain of transistor $M_3$ and with the gates of each of transistors $M_3$, $M_4$, $M_5$, $M_6$ and $M_7$. Each of transistors $M_4$ through $M_7$ sets the DC bias current necessary to operate transistors $Q_3$ through $Q_6$, respectively.

In addition to acting as the biasing circuitry for transistors $Q_4$, $Q_5$, transistors $M_5$, $M_6$ are also arranged to act as a current driver for a load $R_L$. To achieve this, the output $V_{op1}$ of transistor $Q_3$, which shares the same input signal $V_p$ at its base with transistor $Q_4$, is capacitively coupled to the gate of transistor $M_6$. The drain of $M_6$ is coupled with the emitter of transistor $Q_5$. Similarly, the emitter of transistor $Q_6$, where transistors $Q_6$ and $Q_5$ share the same base input of $V_m$, is capacitively coupled to the gate of transistor $M_5$. The drain of transistor $M_5$ is coupled with the emitter of $Q_4$.

In operation, transistors $Q_4$ and $Q_5$ function as emitter followers and transistors $M_5$ and $M_6$ function to minimize transconductance variance in transistors $Q_4$ and $Q_5$ by shifting the burden of driving the load $R_L$ in response to changes at the input terminals $V_p$ and $V_m$ to transistors $M_5$ and $M_6$. Assuming a sinusoidal input signal applied at the positive and negative input terminals $V_p$, $V_m$, and a load $R_L$ connected across the output terminals $V_{op}$, $V_{om}$, the driver circuit 300 functions as described below. As the positive input terminal $V_p$ goes high and negative input terminal $V_m$ goes low, load current $I_L$ goes high. Transistor $Q_4$ pushes current to load $R_L$ at output terminal $V_{op}$ while transistor $M_6$ pulls current from the load at the negative output terminal $V_{om}$. This will result in $I_{p2}$ going low and $I_{m2}$ going high to compensate for variations in $I_L$. At the same time, $V_{gm}$ will follow $V_p$ going high and $V_{gp}$ will follow $V_m$ going low. Conversely, when the negative input terminal $V_m$ goes high and positive input terminal $V_p$ goes low, load current $I_L$ goes low. In this instance, transistor $Q_5$ pushes current to the load via output terminal $V_{om}$ and transistor $M_5$ pulls current from the load $R_L$ via output terminal $V_{op}$. This will result in $I_{p2}$ going high and $I_{m2}$ going low to compensate for variations in L. At the same time $V_{gm}$ will follow $V_p$ going low and $V_{gp}$ will follow $V_m$ going high. The compensation of $I_L$ by $I_{p2}$ and $I_{m2}$ helps to minimize variations in $I_{p1}$ and $I_{m1}$ and thus maintain a more constant transconductance in transistors $Q_4$ and $Q_5$. $Q_4$ and $Q_5$ are preferably not turned off at any time during operation. As the current through transistors $M_5$ and $M_6$ varies, it may reach low enough levels that $M_5$ and/or $M_6$ are in a near off state. Although the driver circuit may operate in instances where $M_5$ and/or $M_6$ turn off during operation, it is preferred that $M_5$ and $M_6$ are biased such that they do not completely turn off. In the event that $M_5$ and/or $M_6$ turn off at some point during operation, it may take more time for these transistors to recover.

Using the arrangement of combination bias and drive transistors $M_5$ and $M_6$, a pair of separate current loops may be defined through the load $R_L$. The first loop, through output transistors $Q_4$ and $Q_5$, may be defined by the relationship $(V_{op}-V_{om})/R_L$. A second current loop through the combination drive and bias transistors $M_5$ and $M_6$ may be defined by the relation $(V_{gm}-V_{gp})/2R_E$, where $V_{gm}$ is the gate voltage of transistor $M_6$, $V_{gp}$ is the gate voltage of transistor $M_5$ and $R_E$ is the value of the resistor connected to the source of transmitters $M_5$ and the source of transistor $M_6$. In this example, it is assumed that resistors $R_{Ep}$ and $R_{Em}$ are equal in value. Recognizing that the two current loops, one through the output transistor $Q_4$ and $R_L$, and output transistor $Q_5$ and a second loop defined through $R_{Ep}$, transistor $M_5$, $R_L$, transistor $M_6$ and $R_{Em}$, must be equal, the following relationship may be developed:

$$\frac{V_{op} - V_{om}}{R_L} = \frac{V_{gm} - V_{gp}}{2R_E}.$$

Assuming that the source voltage at $M_5$ and $M_6$ ($V_{REp}$ and $V_{REm}$, respectively) equals the difference between $V_{gm}$ and $V_{gp}$, then the difference between the output voltages at the emitters of transistors $Q_3$ and $Q_6$ ($V_{op1}$ and $V_{om1}$) may be said to equal $V_{op}-V_{om}$. Thus $V_{op}-V_{om}$ equals $V_{gm}-V_{gp}$ and $R_L=2R_E$. Accordingly, the bias transistors $M_5$ and $M_6$ may be biased such that variations in the load current $I_L$ will be accommodated by increases or decreases in $I_{p2}$ and $I_{m2}$, the current through transistors $M_5$ and $M_6$, rather than by changes in $I_{p1}$, or $I_{m1}$, the current through transistors $Q_3$ and $Q_4$ by selecting the value of resistors $R_{EP}$ and $R_{Em}$ to have a combined value substantially equal to that of the expected load $R_L$.

Figure 4:
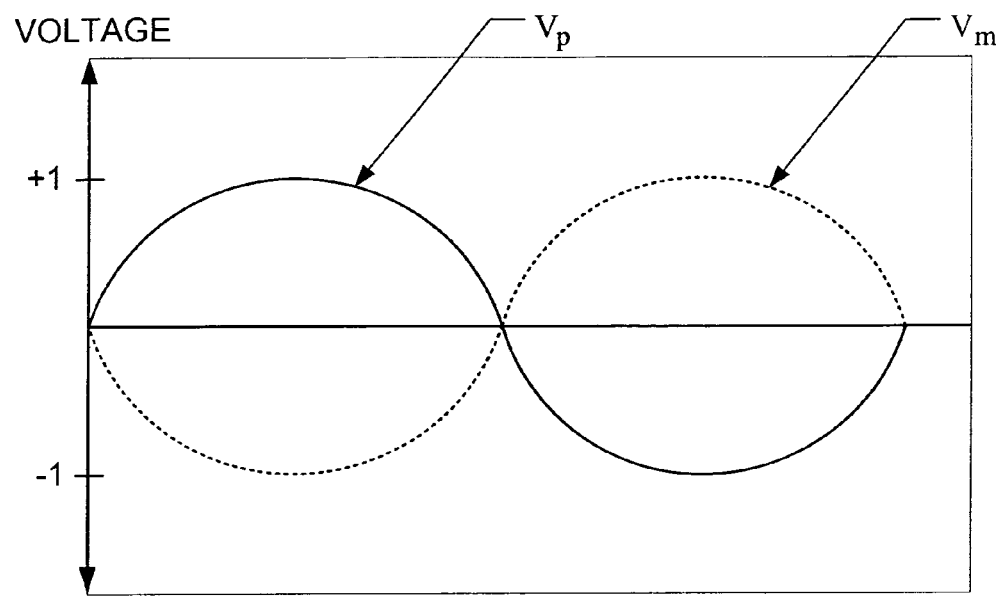
FIG. 4 is a graph illustrating device current response in relation to input voltage for the driver circuit of FIG. 3.
Figure 4:
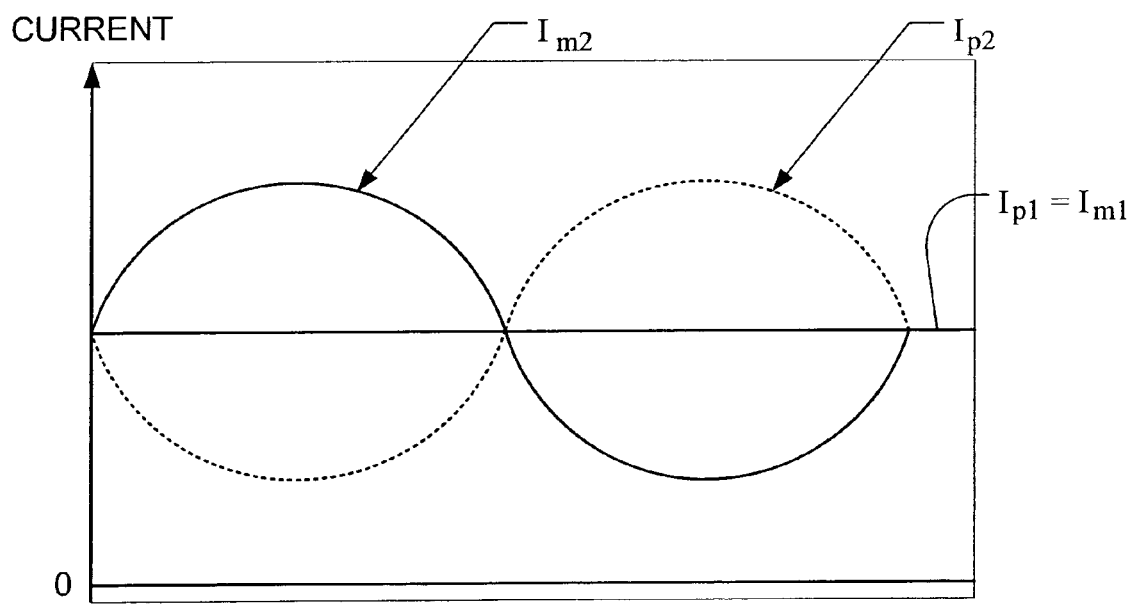

If currents $I_{p2}$ and $I_{m2}$ respond to changes at the input terminals $V_p$ and $V_m$, such that an increase of $I_L$ will cause a proportional drop in $I_{p2}$ and an increase in $I_{m2}$, then any change in current through output transistors $Q_4$ and $Q_5$ is minimized, and ideally equal to zero. It then follows that a substantially constant $I_{p1}$ and $I_{m1}$ would yield a modulation index closer to 1 such that distortion is substantially lower. An idealized relationship of the voltage at the input terminals $V_p$, $V_m$ and the corresponding swings in current through the combination drive and bias transistors $M_5$ and $M_6$ ($I_{p2}$ and $I_{m2}$) is illustrated in FIG. 4. Here, ideally, $I_{p1}$ and $I_{m1}$ are essentially constant so that the transconductance, and therefore output impedance, of $Q_4$ and $Q_5$ is constant. Not only should distortion be reduced, but a substantially constant output impedance may be achieved.

In other embodiments, the transistors $M_3$ through $M_7$ may be the same type of transistors as that used in transistors $Q_3$ through $Q_6$. Additionally, in another variation, where the specific load $R_L$ may not be known in advance, the source resistors $R_{Ep}$, $R_{Em}$ of transistors $M_5$ and $M_6$ may be programmable impedance networks such as resistor networks. Programmable impedance networks may allow for the differential driver circuit 300 to be adapted for use with various loads or may be adjusted to compensate for minor mismatches between the load $R_L$ and variations in the differential driver circuit 300 itself. Although the various transistors in FIG. 3 are illustrated as bipolar junction transistors and field effect transistors, any bipolar junction transistor may be substituted with a field effect transistor and any field effect transistor may be substituted with a bipolar junction transistor. For example, one or all of the bipolar transistors illustrated for $Q_3$-$Q_6$ may be replaced with MOSFET devices.

Also, the differential driver 300 may be implemented without transistors $Q_3$ and $Q_6$. In this variation of the differential driver circuit 300 of FIG. 3, the gates of $M_6$ and $M_5$ would be capacitively coupled directly to input terminals $V_p$ and $V_m$, respectively. Transistors $Q_3$ and $Q_6$ may be helpful if the differential input signal at input terminals $V_p$ and $V_m$ are too weak to drive transistors $M_6$ and $M_5$ without assistance, and can help to compensate for the phase delay at $V_{op}$ and $V_{om}$ caused by transistors $Q_4$ and $Q_5$. However, transistors $Q_3$ and $Q_6$ may be omitted and a similar reduction in distortion achieved. In this variation of the differential driver 300 of FIG. 3 where $Q_3$ and $Q_6$ are omitted, DC bias current devices $M_4$ and $M_7$ are also omitted, and may further reduce power consumption.

In yet other embodiments, it is contemplated that the combined utilization of transistors $M_5$ and $M_6$ for both DC biasing the output transistors $Q_4$ and $Q_5$, as well as driving current to the load $R_L$ in response to changes in $V_p$ and $V_m$, may be divided out into separate functional circuits. As seen in the differential driver circuit 500 of FIG. 5, the devices driving the load $R_L$, here $Q_{11}$ and $Q_{12}$ are arranged as the output load current driving devices, with transistors $M_8$-$M_{11}$, providing DC bias to each of the each of transistors $Q_7$ through $Q_{12}$. Although transistors $Q_7$-$Q_{12}$ are illustrated as bipolar junction transistors, while transistors $M_8$-$M_{11}$ are shown as the field effect transistors, bipolar junction transistors may be substituted for any of the field effect transistors $M_8$-$M_{11}$ and field effect transistors may be used in place of any of the bipolar junction transistors $Q_7$-$Q_{12}$. For example, one or all of the bipolar junction transistors illustrated for $Q_7$-$Q_{12}$ may be replaced with MOSFET devices.

Figure 5:
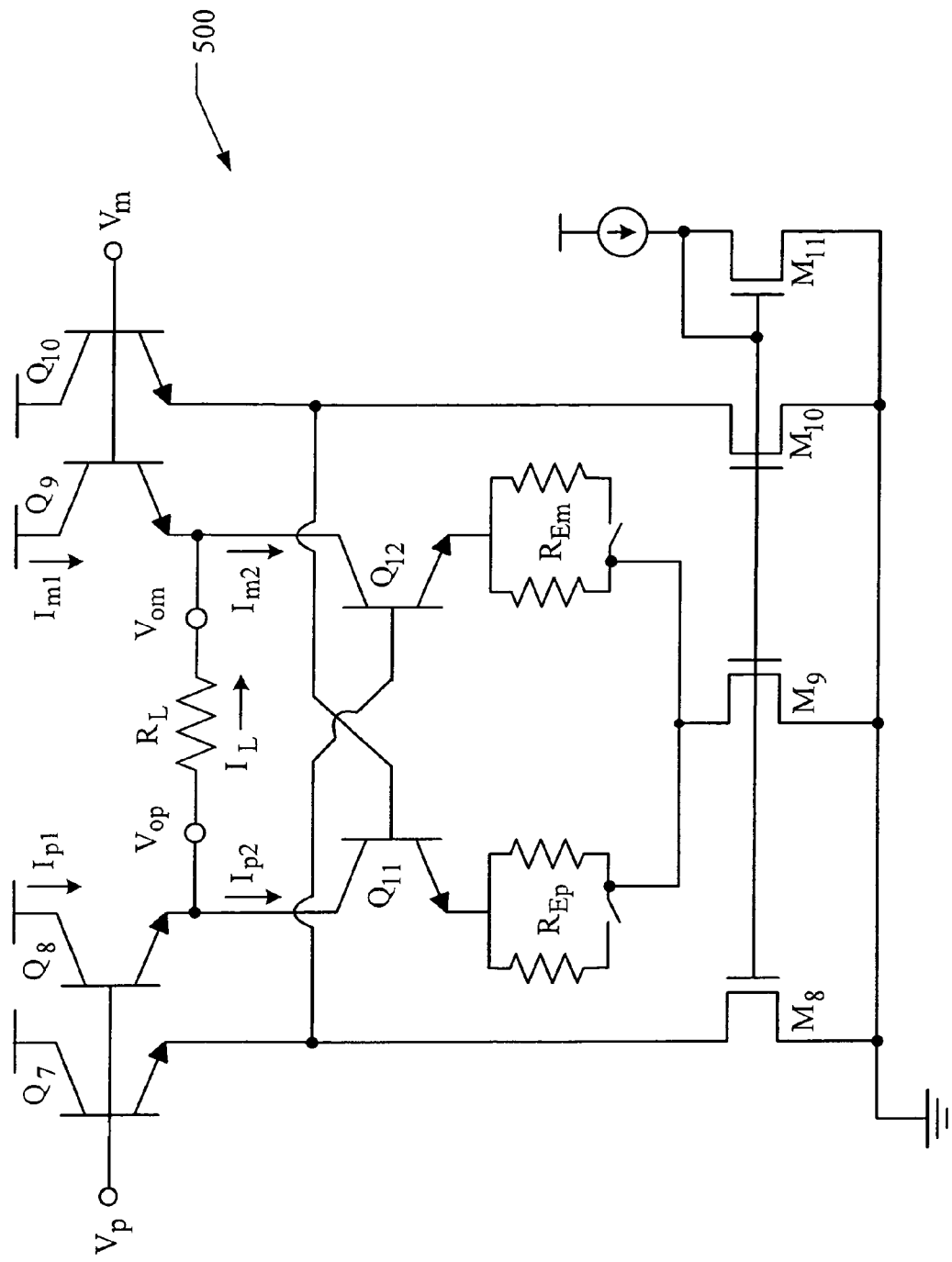
FIG. 5 is a circuit diagram of an alternative embodiment of the driver of FIG. 3.

As shown in the differential driver circuit 500 of FIG. 5, the load current driving circuitry of $Q_{11}$ and $Q_{12}$ is DC coupled to the input terminals $V_p$, $V_m$ via transistors $Q_7$ and $Q_{10}$, respectively. This differs from the AC coupled transistors $M_5$ and $M_6$ in the example of FIG. 3 and allows differential driver circuit 500 to act as a truly push-pull unity buffer. In one embodiment, the transconductance of output transistor $Q_8$ and load current drive transistor $Q_{11}$, and similarly output transistor $Q_9$ and load current transistor $Q_{12}$, are matched. Similar to the differential driver circuit 300 of FIG. 3, the differential driver circuit 500 in FIG. 5 may be optimized to reduce or eliminate variations in current through transistors $Q_8$ and $Q_9$ by providing loads $R_{Ep}$, $R_{Em}$ to each of the emitters of driver transistors $Q_{11}$ and $Q_{12}$ so that the sum of the emitter resistors $R_{Ep}$, $R_{Em}$ equals the load resistance $R_L$.

Also, in the same manner as discussed with reference to the differential driver 300, the differential driver 500 illustrated in FIG. 5 may be implemented without transistors $Q_7$ and $Q_{10}$. In this variation of the differential driver circuit 500 of FIG. 5, the bases of $Q_{12}$ and $Q_{11}$ would be DC coupled directly to input terminals $V_p$ and $V_m$, respectively. Transistors $Q_7$ and $Q_{10}$ may be helpful if the differential input signal at input terminals $V_p$ and $V_m$ are too weak to directly drive $Q_{12}$ and $Q_{11}$ without assistance, and can help to compensate for the phase delay at $V_{op}$ and $V_{om}$ caused by transistors $Q_8$ and $Q_9$. However, transistors $Q_7$ and $Q_{10}$ may be omitted and a similar reduction in distortion achieved. In this variation of the differential driver 500 of FIG. 5 where $Q_7$ and $Q_{10}$ are omitted, DC bias current devices M8 and $M_{10}$ are also omitted, and may further reduce power consumption.

Figure 6:
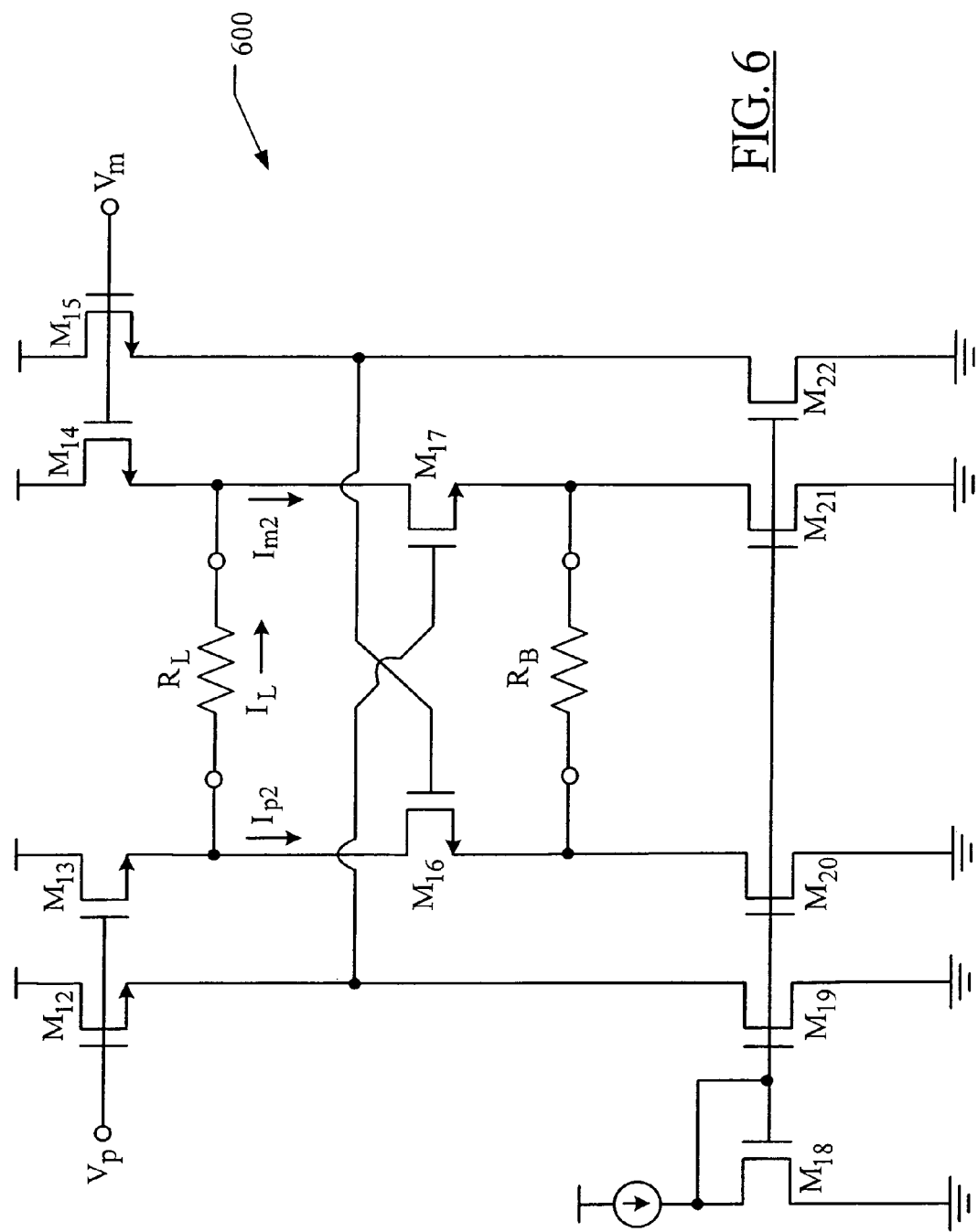
FIG. 6 is a circuit diagram of a second alternative embodiment of the driver of FIG. 3.

An alternative embodiment of a differential driver circuit 600 is illustrated in FIG. 6. In this embodiment, only field effect transistors, $M_{12}$-$M_{22}$, are used throughout the circuit 600. Also, rather than using the drive transistors $M_{16}$ and $M_{17}$ to provide both the drive and bias current, as was the case with the combination bias and drive transistors $M_5$ and $M_6$ in FIG. 3, separate bias transistors $M_{20}$ and $M_{21}$ help control bias current. Furthermore, using the same analysis described above, a single resistor, $R_B$, may be used rather than separate resistors $R_{Ep}$ and $R_{Em}$ shown in the examples of FIGS. 3 and 5. $R_B$ is preferably selected to have the same value as the expected load $R_L$ so that variations in input signals $V_p$ and $V_m$, and variations in the load current $I_L$ may be compensated for by drive transistors $M_{16}$ and $M_{17}$. Also, $R_B$ may be a variable resistor to permit adjustment for fine tuning or to permit for versatility in application of the driver circuit to a range of loads. In yet another embodiment, the differential driver circuit 600 may be configured without an internal impedance $R_B$ and, instead, include terminals to receive an external resistance or complex impedance for $R_B$. With an external $R_B$, a user may have the ability to emulate a more exact match between $R_B$ and $R_L$ by, for example, using a dummy load as $R_B$. Similarly, one or both of $R_{Ep}$ and $R_{Em}$ in the differential drivers 300, 500 of FIGS. 3 and 5 may be externally connected rather than internally provided, such that the sum of $R_{Ep}$ and $R_{Em}$ may be more closely matched to $R_L$.

While the differential driver circuits 300, 500, 600 of FIGS. 3, 5 and 6 illustrate a load between outputs $V_{op}$ and $V_{om}$ as resistive, such as $R_L$ shown in FIGS. 3, 5 and 6, the load may instead be a complex impedance having capacitive and/or inductive elements. Just as the above calculation of a load current loop through the driving devices $Q_{11}$, $Q_{12}$ (FIG. 5) or $M_5$, $M_6$ (FIG. 3) shows the relationship of the bias resistors $R_{Ep}$, $R_{Em}$ to a load $R_L$, a complex load may be driven in the same manner. More specifically, the differential driver circuits 300, 500 of FIGS. 3 and 5 may provide the same low power/low distortion features to a complex load by substituting complex bias impedances for the resistive bias $R_{Ep}$, $R_{Em}$. Similarly, the single bias resistor $R_B$ of FIG. 6 may be replaced with a complex impedance matched to the complex impedance of a load $R_L$. Referring to the embodiment of FIG. 3, although the combination bias/load current driver transistors $M_5$, $M_6$ would need complex impedance bias, the remaining DC bias devices $M_3$, $M_4$ and $M_7$ would not require complex impedance compensation (e.g. capacitive and/or inductive elements) as the DC bias current should not be affected by the complex load on the outputs $V_{op}$, $V_{om}$.

It is contemplated that the differential driver circuits described above may be implemented in any of a number of electronic devices to reduce distortion and power consumption. The differential driver circuits may be integrated in such electronic devices to drive internal loads or loads external to the electronic device. By implementing programmable bias loads $R_{Ep}$, $R_{Em}$, or a single programmable bias load $R_B$, for the load current drive devices (again, as described above, these bias loads may be complex bias loads), as well as a programmable current source $I_{prog}$, it is contemplated that a multipurpose integrated or discrete differential driver assembly may be fabricated. Such a programmable differential driver may be produced as an integrated circuit package that may be used for a number of different devices, and that may provide for implementation in devices having user adjustable modes that allow for switching between types of expected loads.

Figure 7A:
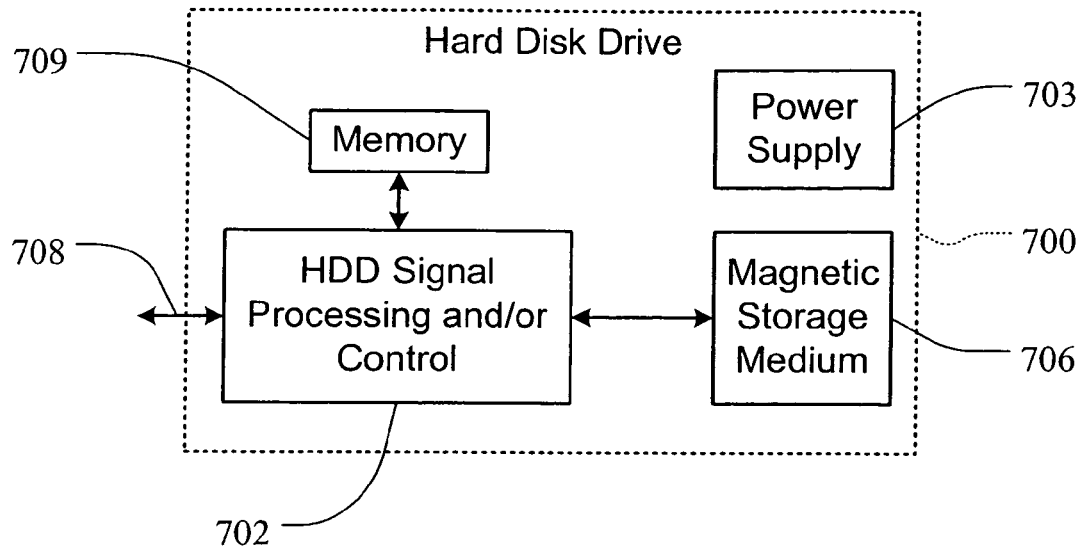
FIG. 7A is a functional block diagram of a hard disk drive.

Examples of electronic devices where the differential driver described above may be utilized are illustrated in. FIGS. 7A-7G. As shown in FIG. 7A, the present invention can be implemented in a hard disk drive (HDD) 700. The present invention may be implemented in either or both of the signal processing and/or control circuits, which are generally identified in FIG. 7A at 702. Another implementation of the low power/low distortion driver circuit in the HDD is in the magnetic sensor or read/write head associated with the magnetic storage medium 706. In some implementations, the signal processing and/or control circuit 702 and/or other circuits within which the above described driver circuit is integrated (not shown) in the HDD 700 may process data, perform coding and/or encryption, perform calculations, and/or format data that is output to and/or received from a magnetic storage medium 706.

The HDD 700 may communicate with a host device (not shown) such as a computer, mobile computing devices such as personal digital assistants, cellular phones, media or MP3 players and the like, and/or other devices via one or more wired or wireless communication links 708. The HDD 700 may be connected to memory 709 such as random access memory (RAM), low latency nonvolatile memory such as flash memory, read only memory (ROM) and/or other suitable electronic data storage.

Figure 7B:
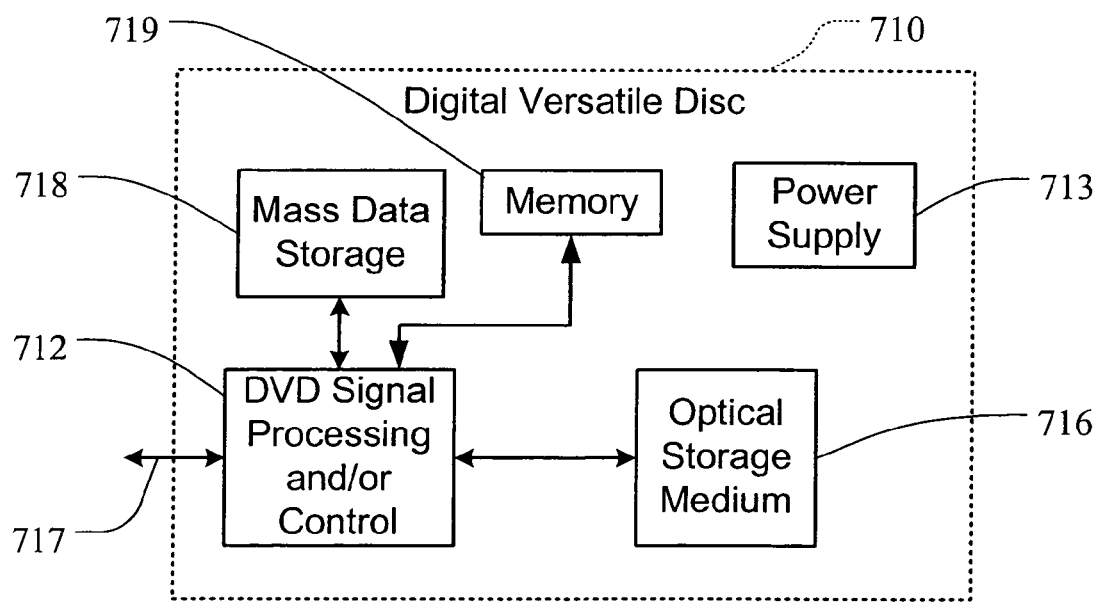
FIG. 7B is a functional block diagram of a digital versatile disk (DVD)

Referring now to FIG. 7B, the present invention can be implemented in a digital versatile disc (DVD) drive 710. The present invention may implement and/or be implemented in either or both signal processing and/or control circuits, which are generally identified in FIG. 7B at 712, and/or mass data storage 718 of the DVD drive 710. The signal processing and/or control circuit 712 and/or other circuits (not shown) in the DVD drive 710 may process data, perform coding and/or encryption, perform calculations, and/or format data that is read from and/or data written to an optical storage medium 716. The differential driver circuits disclosed herein may be integrated into one or more components of the DVD drive 710 to handle various tasks such as buffering digital clock signals. In some implementations, the signal processing and/or control circuit 712 and/or other circuits (not shown) in the DVD drive 710 can also perform other functions such as encoding and/or decoding and/or any other signal processing functions associated with a DVD drive.

The DVD drive 710 may communicate with an output device (not shown) such as a computer, television or other device via one or more wired or wireless communication links 717. The DVD drive 710 may communicate with mass data storage 718 that stores data in a nonvolatile manner. The mass data storage 718 may include a hard disk drive (HDD). The HDD may have the configuration shown in FIG. 7A. The HDD may be a mini HDD that includes one or more platters having a diameter that is smaller than approximately 1.8". The DVD drive 710 may be connected to memory 719 such as RAM, ROM, low latency nonvolatile memory such as flash memory and/or other suitable electronic data storage.

Figure 7C:
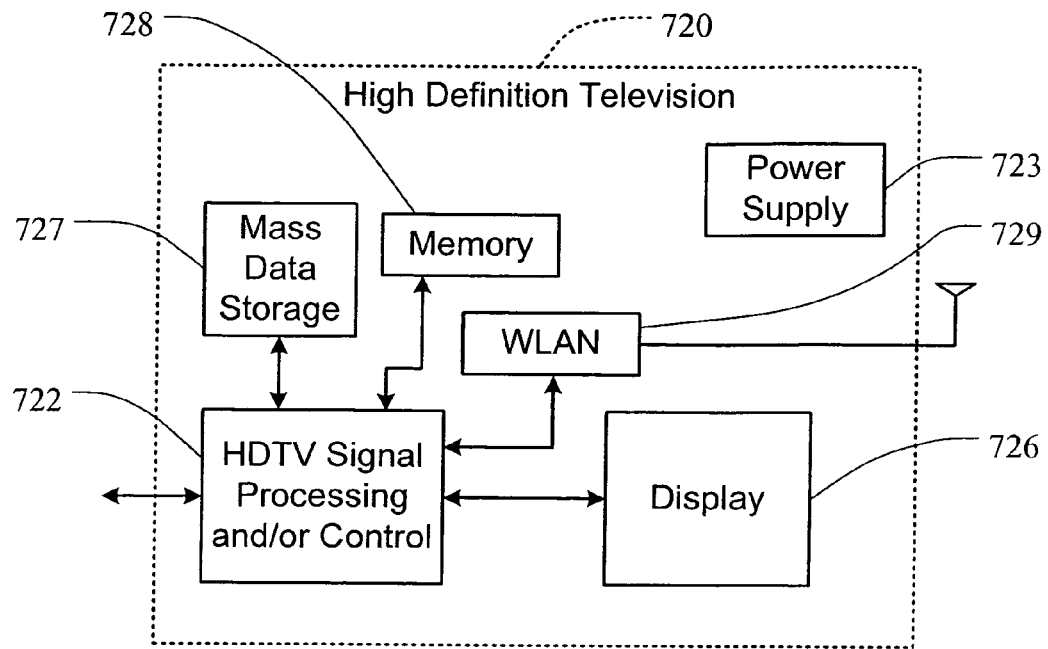
FIG. 7C is a functional block diagram of a high definition television.

Referring now to FIG. 7C, the present invention can be implemented in a high definition television (HDTV) 720. The present invention may implement and/or be implemented in either or both signal processing and/or control circuits, which are generally identified in FIG. 7E at 722. The HDTV 720 receives HDTV input signals in either a wired or wireless format and generates HDTV output signals for a display 726. The driver circuits described above may be part of buffered multiplexers integrated into the HDTV 720 for video applications, such as those needed when multiplexing signals from two video sources. In some other implementations, signal processing circuit and/or control circuit 722 and/or other circuits integrating driver circuits of the type described above (not shown) may process data, perform coding and/or encryption, perform calculations, format data and/or perform any other type of HDTV processing that may be required.

The HDTV 720 may communicate with mass data storage 727 that stores data in a nonvolatile manner such as in optical and/or magnetic storage devices, for example a hard disk drive (HDD). At least one HDD may have the configuration shown in FIG. 7A and/or at least one DVD may have the configuration shown in FIG. 7B. The HDD may be a mini HDD that includes one or more platters having a diameter that is smaller than approximately 1.8"The HDTV 720 may be connected to memory 728 such as RAM, ROM, low latency nonvolatile memory such as flash memory and/or other suitable electronic data storage. The HDTV 720 also may support connections with a WLAN via a WLAN network interface 729.

Figure 7D:
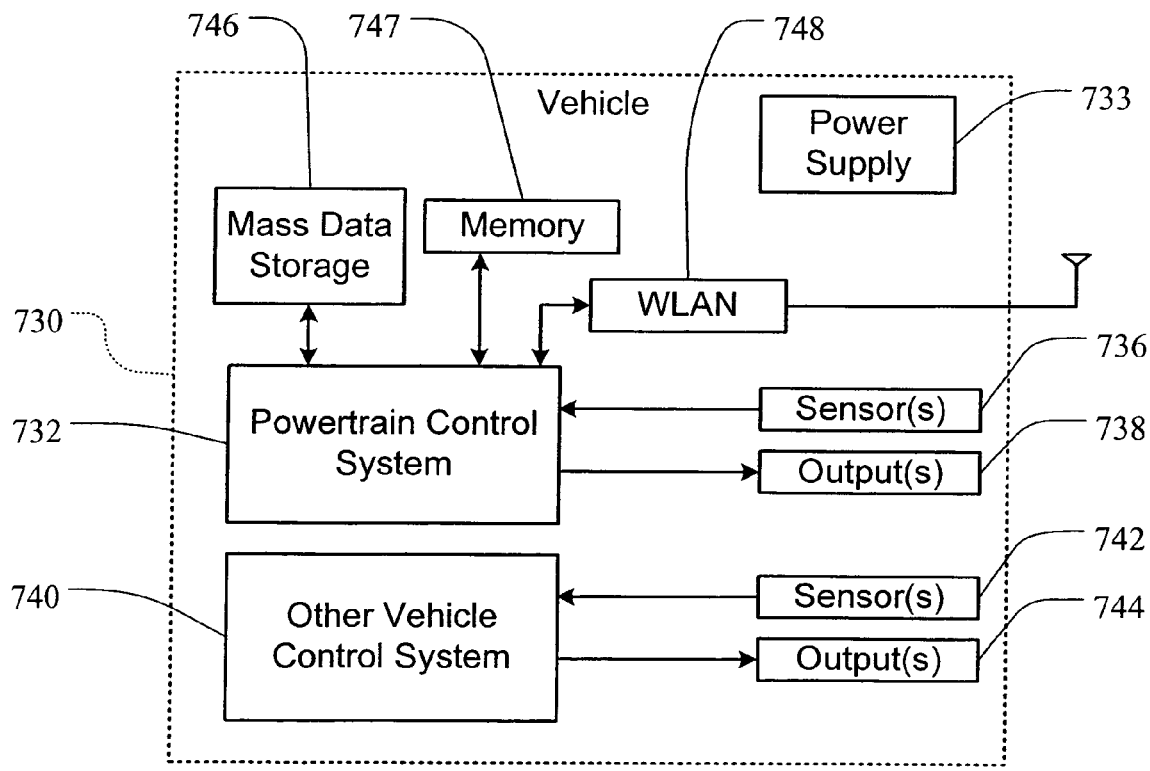
FIG. 7D is a functional block diagram of a vehicle control system.

Referring now to FIG. 7D, the present invention may implement and/or be implemented in a control system of a vehicle 730, a WLAN interface 748, mass data storage 746 of the vehicle control system and/or a power supply 733. In some implementations, the differential driver circuits described herein may be implemented in a powertrain control system 732 to buffer signals in or from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 740 of the vehicle 730. The control system 740 may likewise receive signals from input sensors 742 and/or output control signals to one or more output devices 744. In some implementations, the control system 740 may be part of an anti-lock braking system (ABS), a navigation system, a telematics system, a vehicle telematics system, a lane departure system, an adaptive cruise control system, a vehicle entertainment system such as a stereo, DVD, compact disc and the like. Each of these systems, or communication links between the systems, may integrate the differential driver circuitry described above to handle internal or external loads. Still other implementations are contemplated.

The powertrain control system 732 may communicate with mass data storage 746 that stores data in a nonvolatile manner. The mass data storage 746 may include optical and/or magnetic storage devices for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8"The powertrain control system 732 may be connected to memory 747 such as RAM, ROM, low latency nonvolatile memory such as flash memory and/or other suitable electronic data storage. The powertrain control system 732 also may support connections with a WLAN via a WLAN network interface 748. The control system 740 may also include mass data storage, memory and/or a WLAN interface (all not shown).

Figure 7E:
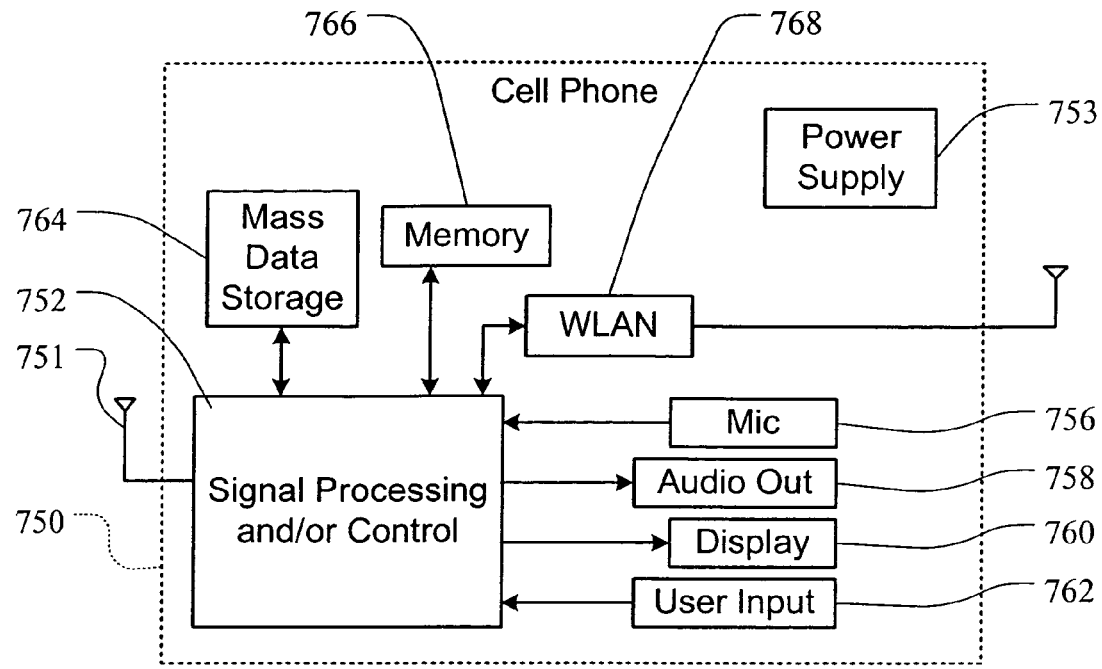
FIG. 7E is a functional block diagram of a cellular phone.

Referring now to FIG. 7E, the present invention can be implemented in a cellular phone 750 that may include a cellular antenna 751. Because of the lower power consumption aspect of the differential driver circuits discussed herein, they may be particularly well-suited to battery powered devices such as cell phones. The disclosed differential driver may be implemented in either or both signal processing and/or control circuits, which are generally identified in FIG. 7E at 752, a WLAN interface 768, and/or mass data storage 764 of the cellular phone 750. In some implementations, the cellular phone 750 includes a microphone 756, an audio output 758 such as a speaker and/or audio output jack, a display 760 and/or an input device 762 such as a keypad, pointing device, voice actuation and/or other input device incorporating the driver circuitry. The signal processing and/or control circuits 752 and/or other circuits (not shown) in the cellular phone 750 may process data, perform coding and/or encryption, perform calculations, format data and/or perform other cellular phone functions.

The cellular phone 750 may communicate with mass data storage 764 that stores data in a nonvolatile manner such as optical and/or magnetic storage devices for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8"The cellular phone 750 may be connected to memory 766 such as RAM, ROM, low latency nonvolatile memory such as flash memory and/or other suitable electronic data storage. The cellular phone 750 also may support connections with a WLAN via a WLAN network interface 768.

Figure 7F:
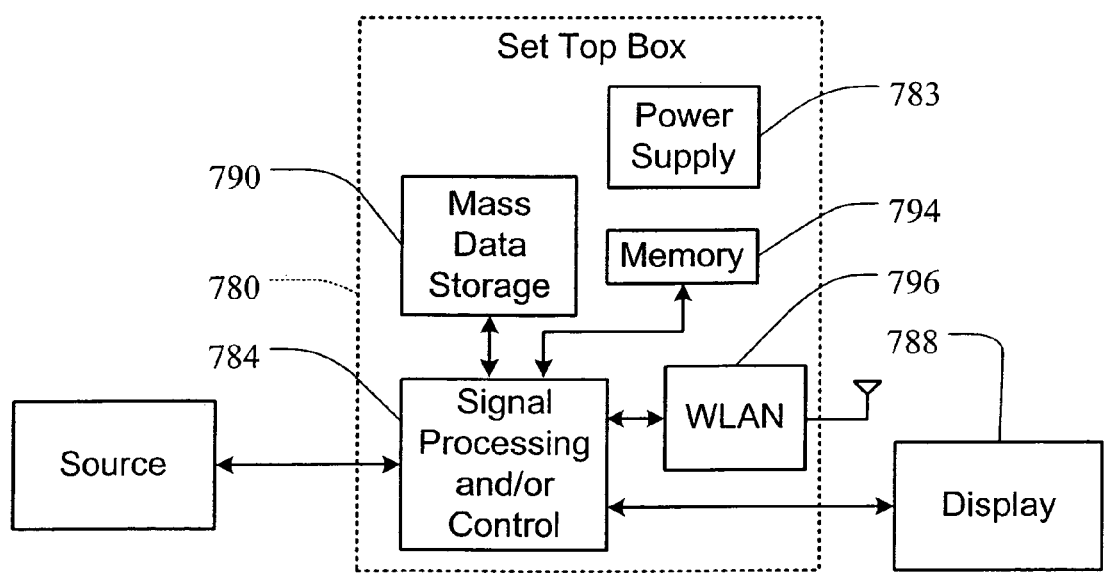
FIG. 7F is a functional block diagram of a set top box.

Referring now to FIG. 7F, the present invention can be implemented in a set top box 780. The differential driver discussed above may be implemented in either or both of the signal processing and/or control circuits, which are generally identified in FIG. 7F at 784, a WLAN interface 796, and/or a mass data storage 790 of the set top box 780. The set top box 780 receives signals from a source such as a broadband source and may output standard and/or high definition audio/video signals, via differential driver circuits integrated in the set top box 780, suitable for a display 788 such as a television and/or monitor and/or other video and/or audio output devices. The signal processing and/or control circuits 784 and/or other circuits (not shown) of the set top box 780 utilizing the differential driver circuitry may process data, perform coding and/or encryption, perform calculations, format data and/or perform any other set top box function.

The set top box 780 may communicate with mass data storage 790 that stores data in a nonvolatile manner. The mass data storage 790 may include optical and/or magnetic storage devices for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8"The set top box 780 may be connected to memory 794 such as RAM, ROM, low latency nonvolatile memory such as flash memory and/or other suitable electronic data storage. The set top box 780 also may support connections with a WLAN via a WLAN network interface 796.

Figure 7G:
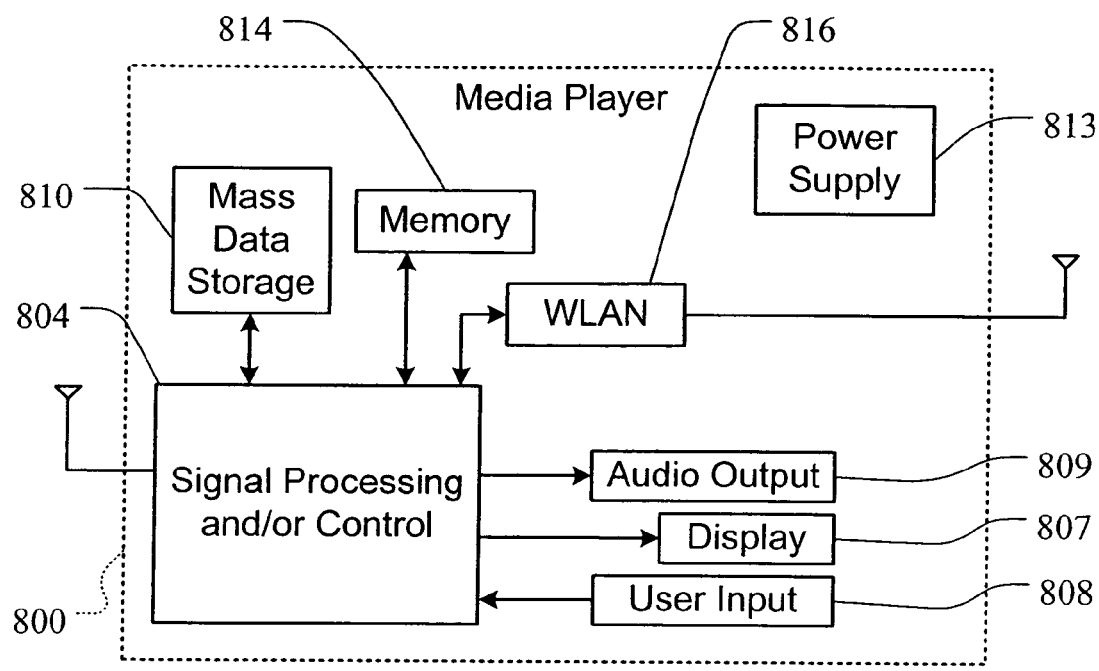
FIG. 7G is a functional block diagram of a media player.

Referring now to FIG. 7G, the disclosed differential driver may also be implemented in a media player 800. The differential driver may be implemented in either or both of the signal processing and/or control circuits, which are generally identified in FIG. 7G at 804, a WLAN interface 816, and/or a mass data storage 810 of the media player 800. In some implementations, the media player 800 includes a display 807 and/or a user input 808 such as a keypad, touchpad and the like integrating one or more differential driver circuits as discussed above. In some implementations, the media player 800 may employ a graphical user interface (GUI) that typically employs menus, drop down menus, icons and/or a point-and-click interface via the display 807 and/or user input 808. The media player 800 further includes an audio output 809 such as a speaker and/or audio output jack. The signal processing and/or control circuits 804 and/or other circuits (not shown) of the media player 800 may process data, perform coding and/or encryption, perform calculations, format data and/or perform any other media player function.

The media player 800 may communicate with mass data storage 810 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8"The media player 800 may be connected to memory 814 such as RAM, ROM, low latency nonvolatile memory such as flash memory and/or other suitable electronic data storage. The media player 800 also may support connections with a WLAN via a WLAN network interface 816. Still other implementations in addition to those described above are contemplated.

It is intended that the foregoing detailed description be understood as an illustration of selected forms that the invention can take and not as a definition of the invention. It is only the following claims, including all equivalents, that are intended to define the scope of this invention.

What is claimed is:

1. A differential circuit comprising:
   first, second, third and fourth devices each comprising a control terminal, a first terminal and a second terminal;
   a first input terminal in communication with the control terminal of the first device, and with the control terminal of the fourth device;
   a second input terminal in communication with the control terminal of the second device, and with the control terminal of the third device;
   a first output terminal in communication with the second terminal of the first device and the first terminal of the third device;
   a second output terminal in communication with the second terminal of the second device and the first terminal of the fourth device; and
   a biasing element in communication with the second terminal of the third and fourth devices, wherein an impedance of the biasing element is substantially equal to an impedance of an expected load between the first and second output terminals.

2. The differential circuit of claim 1, wherein at least one of the devices comprises a transistor.

3. The differential circuit of claim 2, wherein the transistor comprises a bipolar junction transistor.

4. The differential circuit of claim 2, wherein the transistor comprises a field effect transistor.

5. The differential circuit of claim 1, wherein the impedance of the biasing element is a resistive impedance.

6. The differential circuit of claim 1, wherein the impedance of the biasing element is a complex impedance.

7. The differential circuit of claim 1, wherein the biasing element comprises a programmable biasing element in communication with the second terminal of the third and fourth devices, wherein the impedance of the programmable biasing element is programmable to match the impedance of the expected load between the first and second output terminals.

8. The differential circuit of claim 7, wherein the programmable biasing element comprises a programmable resistor.

9. The differential circuit of claim 1, wherein the biasing element comprises a first biasing element associated with the second terminal of the third device and a second biasing element associated with the second terminal of the fourth device, and wherein a sum of impedances of the first and second biasing elements is substantially equal to the impedance of the expected load between the first and second output terminals.

10. The differential circuit of claim 9, wherein at least one of the first and second biasing elements comprises a programmable biasing element.

11. The differential circuit of claim 9, wherein the first and second biasing elements comprise resistors.

12. The differential circuit of claim 1, further comprising:
    first and second capacitors, wherein the first input terminal communicates with the control terminal of the fourth device via the first capacitor, and the second input terminal communicates with the control terminal of the third device via the second capacitor.

13. The differential circuit of claim 1, further comprising at least one bias current source in communication with the second terminal of the third and fourth devices.

14. The differential circuit of claim 13, wherein the at least one bias current source comprises a plurality of bias current sources.

15. The differential circuit of claim 1, wherein the first terminal of the first device communicates with a supply voltage terminal.

16. The differential circuit of claim 15, wherein the first terminal of the second device communicates with the supply voltage terminal.

17. The differential circuit of claim 1, wherein the first and second devices comprise a first transistor type and the third and fourth devices comprise a second transistor type different than the first transistor type.

18. The differential circuit of claim 17, wherein the first transistor type comprises a bipolar junction transistor.

19. The differential circuit of claim 18, wherein the second transistor type comprises a field effect transistor.

20. The differential circuit of claim 1, further comprising:
    fifth and sixth devices each comprising a control terminal, a first terminal and a second terminal;
    wherein the first input terminal is in communication with the control terminal of the fifth device, and the control terminal of the fourth device is in communication with the first input terminal via the fifth device; and
    wherein the second input terminal is in communication with the control terminal of the sixth device, and the control terminal of the third device is in communication with the second input terminal via the sixth device.

21. The differential circuit of claim 20, further comprising:
    first and second capacitors, wherein the second terminal of the fifth device communicates with the control terminal of the fourth device via the first capacitor, and the second terminal of the sixth device communicates with the control terminal of the third device through the second capacitor.

22. The differential circuit of claim 20, wherein the first terminal of the first, second, fifth and sixth devices communicate with a supply voltage.

23. The differential circuit of claim 20, wherein the first, second, fifth and sixth devices comprise a first transistor type and the third and fourth devices comprise a second transistor type.

24. The differential circuit of claim 23, wherein the first transistor type comprises a bipolar junction transistor.

25. The differential circuit of claim 24, wherein the second transistor type comprises a field effect transistor.

26. A differential circuit comprising:
    first and second devices each comprising a control terminal, a first terminal and a second terminal;
    a first input terminal in communication with the control terminal of the first device, wherein the first terminal of the first device is configured for communication with a supply voltage and the second terminal of the first device defining a first output configured for communication with a first terminal of a load;
    a second input terminal in communication with the control terminal of the second device, wherein the first terminal of the second device is configured for communication with the supply voltage and the second terminal of the second device defining a second output configured for communication with a second terminal of the load;
    a biasing network in communication with the first and second input terminals, and with the second terminal of each of the first and second devices, wherein the biasing network is adapted to maintain a DC bias current in each of the first and second devices; and
    wherein the biasing network is further adapted to be responsive to changes in input voltage at the first or second input terminals to supply drive current to the load while maintaining a substantially constant current through the first and second devices.

27. The differential circuit of claim 26, wherein the biasing network comprises:
first and second load current driving devices each comprising a control terminal, a first terminal and a second terminal;
the control terminal of the first load current driving device in communication with the second input terminal, the first terminal of the first load current driving device in communication with the first output and the second terminal of the first load current driving device in communication with a biasing element;
the control terminal of the second load current driving device in communication with the first input terminal, the first terminal of the second load current driving device in communication with the second output and the second terminal of the second load current driving device in communication with the biasing element; and
wherein an impedance of the biasing element substantially equals an impedance of the load.

28. The differential circuit of claim 26, wherein at least one device comprises a transistor.

29. The differential circuit of claim 28, wherein the transistor comprises a bipolar junction transistor.

30. The differential circuit of claim 28, wherein the transistor comprises a field effect transistor.

31. The differential circuit of claim 27, wherein the impedance of the biasing element is a resistive impedance.

32. The differential circuit of claim 27, wherein the impedance of the biasing element is a complex impedance.

33. The differential circuit of claim 27, wherein the biasing element comprises a programmable biasing element in communication with the second terminal of the first and second load current driving devices, wherein the impedance of the programmable biasing element is programmable to match the impedance of the expected load between the first and second output terminals.

34. The differential circuit of claim 33, wherein the programmable biasing element comprises a programmable resistor.

35. The differential circuit of claim 27, wherein the biasing element comprises a first biasing element associated with the second terminal of the first load current driving device and a second biasing element associated with the second terminal of the second load current driving device, and wherein a sum of impedances of the first and second biasing elements is substantially equal to the impedance of the expected load between the first and second output terminals.

36. The differential circuit of claim 35, wherein at least one of the first and second biasing elements comprises a programmable biasing element.

37. The differential circuit of claim 35, wherein the first and second biasing elements comprise resistors.

38. The differential circuit of claim 27, further comprising:
first and second capacitors, wherein the first input terminal communicates with the control terminal of the first load current driving device via the first capacitor, and the second input terminal communicates with the control terminal of the second load current driving device through the second capacitor.

39. The differential circuit of claim 27, further comprising at least one bias current source in communication with the second terminals of the first and second load current driving devices.

40. The differential circuit of claim 39, wherein the at least one bias current source comprises a plurality of bias current sources.

41. The differential circuit of claim 26, wherein the first terminal of the first device communicates with a supply voltage terminal.

42. The differential circuit of claim 41, wherein the first terminal of the second device communicates with the supply voltage terminal.

43. The differential circuit of claim 27, wherein the first and second devices comprise a first transistor type and the first and second load current driving devices comprise a second transistor type different than the first transistor type.

44. The differential circuit of claim 43, wherein the first transistor type comprises a bipolar junction transistor.

45. The differential circuit of claim 44, wherein the second transistor type comprises a field effect transistor.

46. The differential circuit of claim 27, further comprising:
first and second input buffer devices each comprising a control terminal, a first terminal and a second terminal;
wherein the first input terminal is in communication with the control terminal of the first input buffer device, and the control terminal of the second load current driving device is in communication with the first input terminal via the first input buffer device; and
wherein the second input terminal is in communication with the control terminal of the second input buffer device, and the control terminal of the first load current driving device is in communication with the second input terminal via the second input buffer device.

47. The differential circuit of claim 46, further comprising:
first and second capacitors, wherein the second terminal of the first input buffer device communicates with the control terminal of the second load current driving device via the first capacitor, and the second terminal of the second input buffer device communicates with the control terminal of the first load current driving device through the second capacitor.

48. The differential circuit of claim 46, wherein the first and second devices, and the first and second input buffer devices comprise a first transistor type and the first and second load current driving devices comprise a second transistor type.

49. The differential circuit of claim 48, wherein the first transistor type comprises a bipolar junction transistor.

50. The differential circuit of claim 49, wherein the second transistor type comprises a field effect transistor.

51. A differential circuit comprising:
first and second devices each comprising a control terminal, a first terminal and a second terminal;
a first input terminal in communication with the control terminal of the first device, wherein the first terminal of the first device is configured for communication with a supply voltage and the second terminal of the first device defining a first output configured for communication with a first end of a load;
a second input terminal in communication with the control terminal of the second device, wherein the first terminal of the second device is configured for communication with the supply voltage and the second terminal of the second device defining a second output configured for communication with a second end of the load;
means for maintaining a DC bias current in each of the first and second devices; and
means for supplying drive current to the load in response to changes in input voltage at the first and second input terminals while maintaining a substantially constant current through the first and second devices.

52. The differential circuit of claim 51, wherein the means for supplying drive current comprises:
first and second load current driving devices each comprising a control terminal, a first terminal and a second terminal;
the control terminal of the first load current driving device in communication with the second input terminal, the first terminal of the first load current driving device in communication with the first output and the second terminal of the first load current driving device in communication with a biasing element;
the control terminal of the second load current driving device in communication with the first input terminal, the first terminal of the second load current driving device in communication with the second output and the second terminal of the second load current driving device in communication with the biasing element; and
wherein an impedance of the biasing element substantially equals an impedance of the load.

53. The differential circuit of claim 52, wherein the devices comprise transistors.

54. The differential circuit of claim 53, wherein the transistors comprise bipolar junction transistors.

55. The differential circuit of claim 53, wherein the transistors comprise field effect transistors.

56. The differential circuit of claim 52, wherein the impedance of the biasing element is a resistive impedance.

57. The differential circuit of claim 52, wherein the impedance of the biasing element is a complex impedance.

58. The differential circuit of claim 52, wherein the biasing element comprises a programmable biasing element in communication with the second terminal of the first and second load current driving devices, wherein the impedance of the programmable biasing element is programmable to match the impedance of the load between the first and second output terminals.

59. The differential circuit of claim 52, wherein the biasing element comprises a first biasing element associated with the second terminal of the first load current driving device and a second biasing element associated with the second terminal of the second load current driving device, and wherein a sum of impedances of the first and second biasing elements is substantially equal to the impedance of the load between the first and second output terminals.

60. The differential circuit of claim 52, further comprising:
first and second input buffer devices each comprising a control terminal, a first terminal and a second terminal;
wherein the first input terminal is in communication with the control terminal of the first input buffer device, and the control terminal of the second load current driving device is in communication with the first input terminal via the first input buffer device; and
wherein the second input terminal is in communication with the control terminal of the second input buffer device, and the control terminal of the first load current driving device is in communication with the second input terminal via the second input buffer device.

61. The differential circuit of claim 60, wherein the first and second devices, and the first and second input buffer devices comprise a first transistor type and the first and second load current driving devices comprise a second transistor type.

62. The differential circuit of claim 61, wherein the first transistor type comprises a bipolar junction transistor.

63. The differential circuit of claim 62, wherein the second transistor type comprises a field effect transistor.

64. A method for driving a load with a differential circuit comprising:
receiving a first input signal at a first device;
receiving a second input signal at a second device;
providing a load current to a load in communication with the first and second devices;
maintaining a substantially constant device current in each of the first and second devices when the load current changes, and
introducing a phase delay between the first input signal and the load current drive circuit,
wherein maintaining a substantially constant device current comprises automatically adjusting the load current via a load current drive circuit in response to a change in the first or second input signals.

65. The method of claim 64, wherein the phase delay is substantially equal to a phase delay introduced to the first input signal by the first device between an input of the first device and an output of the first device.

* * * * *